(12) United States Patent
Yang et al.

(10) Patent No.: US 10,755,636 B2
(45) Date of Patent: Aug. 25, 2020

(54) PIXEL CIRCUIT AND DRIVING METHOD FOR THE SAME, DISPLAY SUBSTRATE AND DISPLAY DEVICE

(71) Applicant: BOE TECHNOLOGY GROUP CO., LTD., Beijing (CN)

(72) Inventors: Chengchung Yang, Beijing (CN); Xueling Gao, Beijing (CN); Kuanjun Peng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/214,887

(22) Filed: Dec. 10, 2018

(65) Prior Publication Data
US 2019/0189054 A1 Jun. 20, 2019

(30) Foreign Application Priority Data
Dec. 14, 2017 (CN) .......................... 2017 1 1339788

(51) Int. Cl.
 G09G 3/32 (2016.01)
 G09G 3/3233 (2016.01)
 G09G 3/3258 (2016.01)
 H01L 27/32 (2006.01)
 G09G 3/3275 (2016.01)
 G09G 3/3266 (2016.01)

(52) U.S. Cl.
 CPC ......... *G09G 3/3233* (2013.01); *G09G 3/3258* (2013.01); *G09G 3/3266* (2013.01); *G09G 3/3275* (2013.01); *H01L 27/3244* (2013.01); *G09G 2300/0861* (2013.01); *G09G 2310/0251* (2013.01); *G09G 2310/0262* (2013.01); *G09G 2320/0257* (2013.01)

(58) Field of Classification Search
None
See application file for complete search history.

(56) References Cited

U.S. PATENT DOCUMENTS

2016/0125808 A1* 5/2016 Hsu ...................... G09G 3/3233
345/212

* cited by examiner

*Primary Examiner* — Joseph R Haley
(74) *Attorney, Agent, or Firm* — Nath, Goldberg & Meyer; Joshua B. Goldberg; Stephanie F. Majkut (57) ABSTRACT

The present disclosure discloses a pixel circuit and a driving method thereof, a display substrate and a display device, the pixel circuit includes: an initialization sub-circuit, a writing compensation sub-circuit, a light-emitting enabling sub-circuit, a light-emitting device, and a driving sub-circuit, the light-emitting enabling sub-circuit is configured to couple the driving sub-circuit to the light-emitting device under control of an enabling signal terminal. The initialization sub-circuit is configured to input a voltage of an initial voltage terminal to a gate of a driving transistor in the driving sub-circuit under control of a reset signal terminal to initialize the driving sub-circuit. The writing compensation sub-circuit is configured to input, under control of a scanning signal terminal, a data voltage output from a data signal terminal to the driving sub-circuit to perform data compensation on the driving sub-circuit.

19 Claims, 6 Drawing Sheets

PIXEL CIRCUIT AND DRIVING METHOD FOR THE SAME, DISPLAY SUBSTRATE AND DISPLAY DEVICE

CROSS-REFERENCE TO RELATED APPLICATIONS

The present application claims priority to Chinese Patent Application No. 201711339788.9, filed on Dec. 14, 2017, the disclosure of which is hereby incorporated by reference in its entirety.

TECHNICAL FIELD

The present disclosure relates to the field of display technology, and in particular, to a pixel circuit and a driving method for the pixel circuit, a display substrate and a display device.

BACKGROUND

Organic light-emitting diode display is one of key research fields of flat panel display at present. Compared with liquid crystal display, organic light-emitting diode (OLED) display has advantages of low energy consumption, low production cost, self-illumination, wide viewing angle and fast response speed.

SUMMARY

The present disclosure provides a pixel circuit, including: an initialization sub-circuit, a writing compensation sub-circuit, a light-emitting enabling sub-circuit, a light-emitting device and a driving sub-circuit, the driving sub-circuit includes a driving transistor configured to supply a driving current to the light-emitting device; the light-emitting enabling sub-circuit is respectively coupled to an enabling signal terminal, the driving sub-circuit and the light-emitting device, and is configured to electrically couple the driving sub-circuit to the light-emitting device under control of the enabling signal terminal; the initialization sub-circuit is respectively coupled to a first power voltage terminal, an initial voltage terminal, a reset signal terminal and the driving sub-circuit, and is configured to input, under control of the reset signal terminal, a voltage of the initial voltage terminal to the driving sub-circuit to initialize the driving sub-circuit; the writing compensation sub-circuit is respectively coupled to a scanning signal terminal, a data signal terminal, a reference signal terminal and the driving sub-circuit, and is configured to input, under control of the scanning signal terminal, a data voltage output by the data signal terminal to the driving sub-circuit to perform a data compensation on the driving sub-circuit.

In some implementations, the initialization sub-circuit is further coupled to the light-emitting enabling sub-circuit to input, under control of the enabling signal terminal and the reset signal terminal, the voltage of the initial voltage terminal to the driving sub-circuit through the light-emitting enabling sub-circuit to initialize the driving sub-circuit.

In some implementations, the initialization sub-circuit includes a first transistor and a second transistor, a first electrode of the first transistor is electrically coupled to the first power voltage terminal, a second electrode of the first transistor is electrically coupled to a first electrode of the driving transistor, and a gate of the first transistor is electrically coupled to the reset signal terminal; a first electrode of the second transistor is electrically coupled to the initial voltage terminal, a second electrode of the second transistor is electrically coupled to the light-emitting enabling sub-circuit, and a gate of the second transistor is electrically coupled to the reset signal terminal.

In some implementations, the first transistor is an N-type transistor, and the second transistor is a P-type transistor, or the first transistor is a P-type transistor and the second transistor is an N-type transistor.

In some implementations, the light-emitting enabling sub-circuit includes a sixth transistor; a first electrode of the sixth transistor is electrically coupled to the light-emitting device and the initialization sub-circuit respectively, a second electrode of the sixth transistor is electrically coupled to a second electrode of the driving transistor, and a gate of the sixth transistor is electrically coupled to the enabling signal terminal.

In some implementations, the writing compensation sub-circuit includes a third transistor, a fourth transistor, a fifth transistor and a storage capacitor; a first electrode of the third transistor is electrically coupled to the data signal terminal, a second electrode of the third transistor is electrically coupled to a second end of the storage capacitor, and a gate of the third transistor is electrically coupled to the scanning signal terminal; a first electrode of the fourth transistor is electrically coupled to the reference signal terminal, a second electrode of the fourth transistor is electrically coupled to the second end of the storage capacitor, and a gate of the fourth transistor is electrically coupled to the scanning signal terminal; a first electrode of the fifth transistor is electrically coupled to the second electrode of the driving transistor, a second electrode of the fifth transistor is coupled to a gate of the driving transistor, and a gate of the fifth transistor is electrically coupled to the scanning signal terminal; a first end of the storage capacitor is electrically coupled to the gate of the driving transistor, and the second end of the storage capacitor is electrically coupled to the data signal terminal and the reference signal terminal.

In some implementations, the third transistor and the fifth transistor are N-type transistors; the fourth transistor is a P-type transistor; alternatively, the third transistor and the fifth transistor are P-type transistors; and the fourth transistor is an N-type transistor.

In some implementations, the light-emitting device includes a light-emitting diode; a first electrode of the light-emitting diode is electrically coupled to the second electrode of the sixth transistor, and a second electrode of the light-emitting diode is electrically coupled to a second power voltage terminal.

The present disclosure further provides a display substrate, including: a plurality of sub-pixel units arranged in an array, each of the sub-pixel units including the above pixel circuit.

The present disclosure further provides a display device, including the above display substrate.

The present disclosure further provides a driving method for the above pixel circuit, the driving method includes a initialization phase, a writing compensation phase and a light-emitting phase, in the initialization phase, under control of the reset signal terminal, the voltage of the initial voltage terminal is input to the driving sub-circuit to initialize the driving sub-circuit; in the writing compensation phase, under control of the scanning signal terminal, the data voltage is supplied, by the writing compensation sub-circuit, to the driving sub-circuit through the data signal terminal, and a data compensation is performed on the driving sub-circuit; in the light-emitting phase, under control of the enabling signal terminal, the driving sub-circuit is coupled, by the light-emitting enabling sub-circuit, to the light-emitting device, so that the driving sub-circuit provides a driving current to the light-emitting device.

DETAILED DESCRIPTION

In order to further explain the technical means and functions of the present disclosure for achieving the intended purpose of the disclosure, specific implementations, structures, features and functions of the pixel circuit according to the present disclosure will be described in detail below with reference to the accompanying drawings and embodiments, and the description is as follows.

Figure 1:
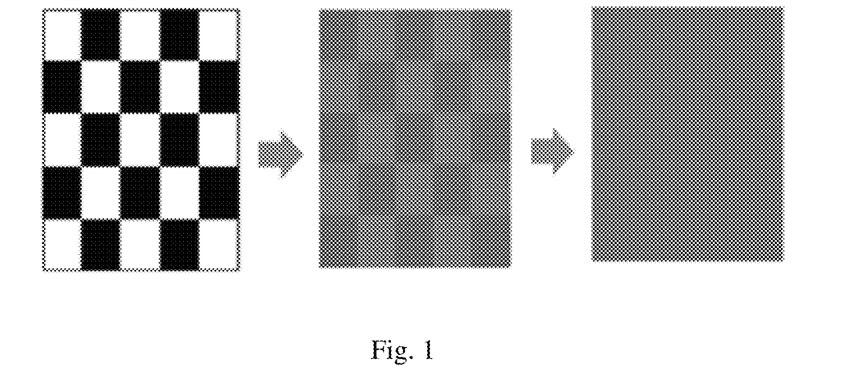
FIG. 1 is a schematic diagram illustrating switching between images during which residual image exists in the related art.

The pixel circuit in an OLED display is generally driven by current, which requires a stable current to control the organic light-emitting diode to emit light. In the related art, as shown in FIG. 1, during the black-and-white-grid image switching to a gray image, due to initial gate-source voltages of the driving transistors in the sub-pixels of different color squares of the OLED display are different, so the driving currents of the light-emitting devices are different, so that a graphic of original image is retained in process of switching the black-and-white-grid image to the gray image, which causes a short-term residual image and seriously affect the display effect.

Figure 3:
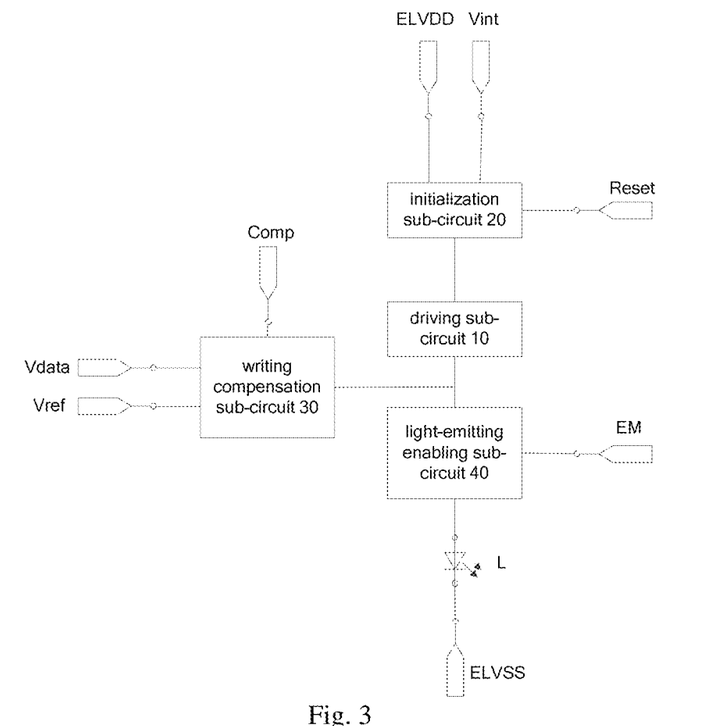
FIG. 3 is a structural block diagram of another pixel circuit according to an embodiment of the present disclosure.

In an aspect, an embodiment of the present disclosure provides a pixel circuit, as shown in FIG. 3, including: a driving sub-circuit 10, an initialization sub-circuit 20, a writing compensation sub-circuit 30, a light-emitting enabling sub-circuit 40, and a light-emitting device L, the driving sub-circuit 10 includes a driving transistor for supplying current to the light-emitting device L; the light-emitting enabling sub-circuit 40 is respectively coupled to an enabling signal terminal EM, the driving sub-circuit 10 and the light-emitting device L, and is configured to electrically couple the driving sub-circuit 10 to the light-emitting device L under the control of the enabling signal terminal EM, so that the driving sub-circuit 10 provides a driving current to the light-emitting device L; the initialization sub-circuit 20 is respectively coupled to a first power voltage terminal ELVDD, an initial voltage terminal Vint, a reset signal terminal Reset and the driving sub-circuit 10, and is configured to input, under the control of the reset signal terminal Reset, a voltage of the initial voltage terminal Vint to the driving sub-circuit 10 to initialize the driving sub-circuit 10; the writing compensation sub-circuit 30 is respectively coupled to a scanning signal terminal Comp, a data signal terminal Vdata, a reference signal terminal Vref, and the driving sub-circuit 10, and is configured to input, under the control of the scanning signal terminal Comp, a data voltage output by the data signal terminal Vdata to the driving sub-circuit 10, so as to perform a data compensation on the driving sub-circuit 10.

The driving transistor may be a P-type transistor, a first electrode of the driving transistor may be a source, and a second electrode of the driving transistor may be a drain. It should be noted that the size of the driving transistor is relatively large and has a certain driving capability, therefore the driving transistor can supply, under the action of the voltage output by the first power voltage terminal ELVDD, a driving current to the light-emitting device L to drive the light-emitting device L to emit light.

An operation process and principle of the pixel circuit in the present embodiment are specifically described below. The operation process of the pixel circuit includes an initialization phase, a writing compensation phase and a light-emitting phase.

In the initialization phase, under the control of the reset signal terminal Reset, the voltage of the initial voltage terminal Vint is input to the driving sub-circuit 10, so that the driving sub-circuit 10 is initialized.

In the writing compensation phase, under the control of the scanning signal terminal Comp, the writing compensation sub-circuit 30 supplies the data voltage to the driving sub-circuit 10 through the data signal terminal Vdata, and performs data compensation on the driving sub-circuit 10.

In the light-emitting phase, under the control of the enabling signal terminal EM, the light-emitting enabling sub-circuit 40 electrically couples the driving sub-circuit 10 to the light-emitting device L, so that the driving sub-circuit 10 supplies the driving current to the light-emitting device L.

The advantages of the pixel circuit provided by the present disclosure are explained below by means of the hysteresis effect of the display substrate. The process of the hysteresis effect of the display substrate adopting the pixel circuit of the present disclosure is as shown in FIG. 4, where the dash-dotted line is a characteristic graph showing a relationship between the current Ids and the gate-source voltage Vgs of the driving transistor (which is an example of the driving sub-circuit) in a sub-pixel in a black region in the OLED display, when the source-drain voltage of the driving transistor in the initialization phase is Vds1; the dotted line is a characteristic graph showing a relationship between the current Ids and the gate-source voltage Vgs of the driving transistor in a sub-pixel in a white region in the OLED display, when the source-drain voltage of the driving transistor in the initialization phase is Vds3; the solid line is a characteristic graph showing a relationship between the current Ids and the gate-source voltage Vgs of the driving transistor in a sub-pixel, when the source-drain voltage of the driving transistor in the initialization phase is Vds2 and a middle gray image is displayed.

Figure 4:
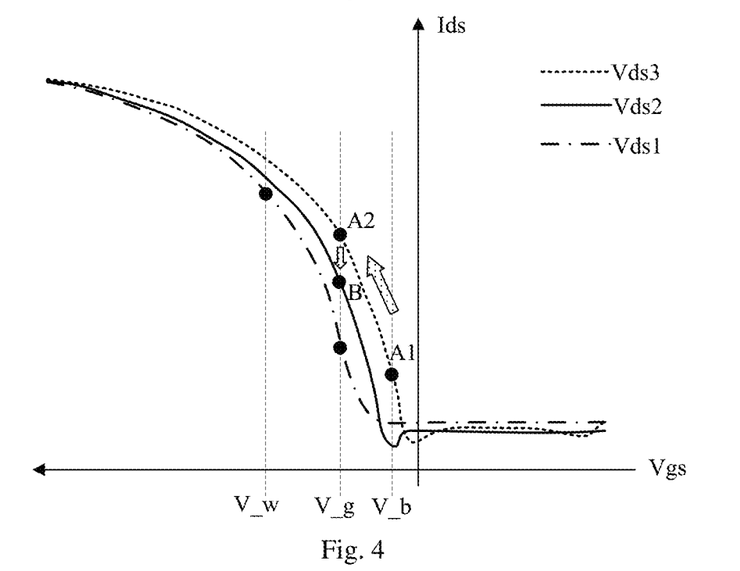
FIG. 4 is a schematic diagram illustrating a hysteresis effect according to an embodiment of the present disclosure.

As shown in FIG. 1 and FIG. 4, in the initialization phase, in the pixel circuits of sub-pixels of the display substrate, all the driving transistors are in turn-on state. At this time, the gate-source voltages Vgs of the driving transistors are the same, and are at the lowermost ends of their respective characteristics, their corresponding currents Ids are the same (corresponding to the point A1 in FIG. 4), and the current Ids is small, but since the charge trapping states of the driving transistors in all the sub-pixels are the same, based on which, when a next frame of image is displayed, the current Ids of the driving transistor in each sub-pixel needs to be increased, therefore, charge trapping needs to be performed at the interface between semiconductor layer and the gate insulating layer in the sub-pixel, so that the current Ids can be increased from the point A1 to the point A2, and the Vgs changes from V_b to V_g, and the charge releasing paths of the respective driving transistors are the same, thereby improving the problem of short-term residual image caused by the hysteresis effect, so that the brightness of all the sub-pixels can reach the brightness corresponding to the point B.

It should be noted that the initialization phase is a time period between adjacent frames of image, and is used to eliminate the residual image of the previous frame of image. For any frame of image, it is subjected to a progressive scanning from a gate line for the first row of sub-pixels to a gate line for the last row of sub-pixels. Therefore, the initialization phase occurs after the last row of sub-pixels of the previous frame of image is scanned and display of the last row of sub-pixels is completed and before scanning of the first row of sub-pixels of the next frame of image is started.

An embodiment of the present disclosure provides a pixel circuit including: an initialization sub-circuit, a driving sub-circuit, a writing compensation sub-circuit, a light-emitting enabling sub-circuit and a light-emitting device. When switching from a frame of image to the next one, the initialization sub-circuit can input, under the control of the reset signal terminal, the voltage of the initial voltage terminal to the gate of the driving transistor in the driving sub-circuit, and the voltage of the source of the driving transistor can be continuously discharged to the initial voltage terminal when the driving transistor is turned on, until the gate-source voltage of the driving transistor becomes the threshold voltage of the driving transistor, at which the driving transistor is turned off. Since the initial gate-source voltage of the driving transistor in each of the sub-pixels in the display substrate becomes the threshold voltage of the driving transistor, all the driving transistors in the sub-pixels of the display substrate are in a same charge trapping state. Therefore, regardless of the data voltage of the previous frame of image, all the driving transistors enter into a data voltage writing state from the same state when entering the next frame of image, thereby improving the short-term residual image problem due to the hysteresis effect. In addition, in the pixel circuit, the data voltage outputted by the data signal terminal can be further input, by the writing compensation sub-circuit, to the driving transistor of the driving sub-circuit in the compensation phase to perform data compensation on the driving transistor, so that the driving current input to the light-emitting device when the light-emitting device emits light is independent of the threshold voltage of the driving transistor, thereby eliminating the influence of the threshold voltage on the brightness of the emitted light, and achieving data compensation for the driving sub-circuit.

Figure 2:
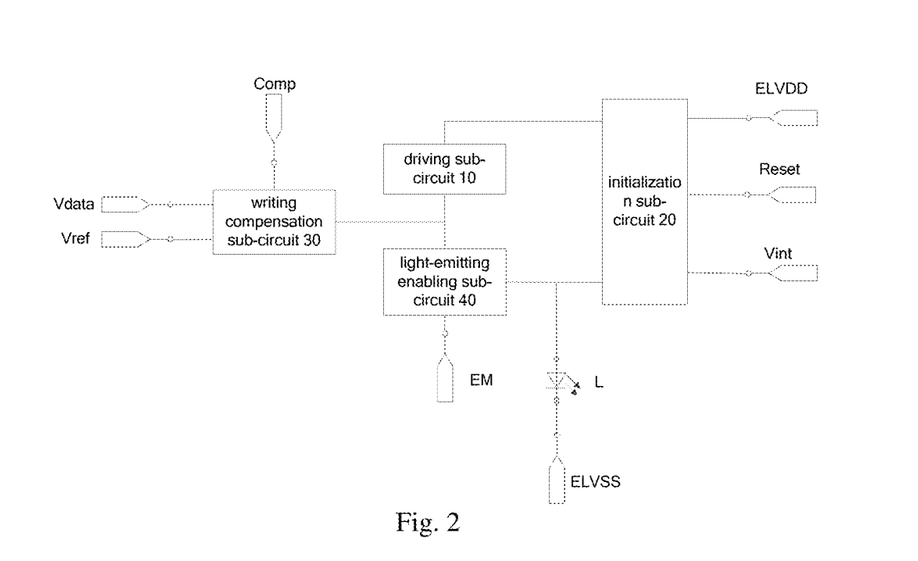
FIG. 2 is a structural block diagram of a pixel circuit according to an embodiment of the present disclosure.
Figure 5:
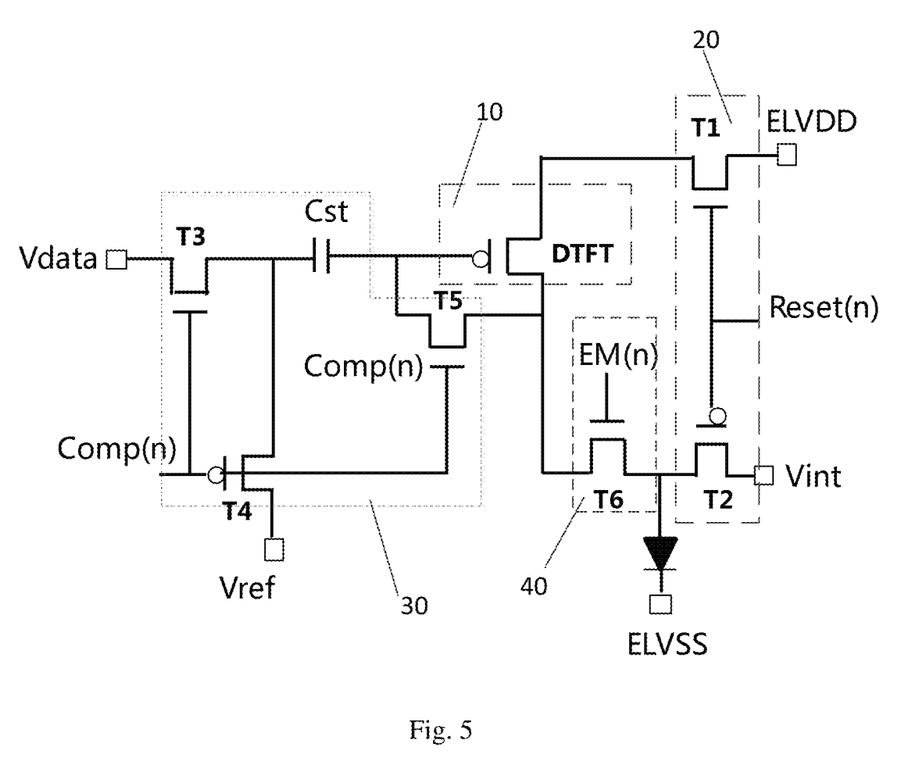
FIG. 5 is a schematic diagram of a specific structure of the pixel circuit shown in FIG. 2.

In some implementations, as shown in FIG. 2 and FIG. 5, the driving sub-circuit 10 includes a driving transistor DTFT; the gate of the driving transistor DTFT is electrically coupled to the writing compensation sub-circuit 30, and the first electrode of the driving transistor DTFT is coupled to the initialization sub-circuit 20, and the second electrode of the driving transistor DTFT is electrically coupled to the writing compensation sub-circuit 30 and the light-emitting enabling sub-circuit 40.

It should be noted that the driving sub-circuit 10 may further include a plurality of driving transistors DTFT coupled in parallel. The foregoing is merely an example of the driving sub-circuit 10. Other structures having the same functions as those of the driving sub-circuit 10 are not described herein again, but all of them should fall within the protection scope of the present disclosure.

In some implementations, as shown in FIG. 2 and FIG. 5, the initialization sub-circuit 20 is further coupled to the light-emitting enabling sub-circuit 40, and is configured to input, through the light-emitting enabling sub-circuit 40, the voltage of the initial voltage terminal Vint to the driving sub-circuit 10 under the control of the enabling signal terminal EM and the reset signal terminal Reset, so that the driving sub-circuit 10 is initialized. In the present embodiment, a terminal of the initialization sub-circuit 20 is coupled to the driving sub-circuit 10 through the light-emitting enabling sub-circuit 40. In the initialization phase, the light-emitting enabling sub-circuit 40 can be turned on, so that the voltage of the initial voltage terminal Vint can be input to the driving sub-circuit 10 through the light-emitting enabling sub-circuit 40 to initialize the driving sub-circuit 10.

Further, the initialization sub-circuit 20 includes a first transistor T1 and a second transistor T2, a first electrode of the first transistor T1 is electrically coupled to the first power voltage terminal ELVDD, and a second electrode of the first transistor T1 is electrically coupled to the first electrode of the driving transistor DTFT, and the gate of the first transistor T1 is electrically coupled to the reset signal terminal Reset, a first electrode of the second transistor T2 is electrically coupled to the initial voltage terminal Vint, a second electrode of the second transistor T2 is electrically coupled to the light-emitting enabling sub-circuit 40, and a gate of the second transistor T2 is electrically coupled to the reset signal terminal Reset.

It should be noted that, in this embodiment, the initialization sub-circuit 20 may further include a plurality of switching transistors coupled in parallel with the first transistor T1 and/or a plurality of switching transistors coupled in parallel with the second transistor T2. The foregoing is only an example of the initialization sub-circuit 20, and other structures having the same functions as those of the initialization sub-circuit 20 are not described herein again, but all of them should fall within the protection scope of the present disclosure.

Figure 6:
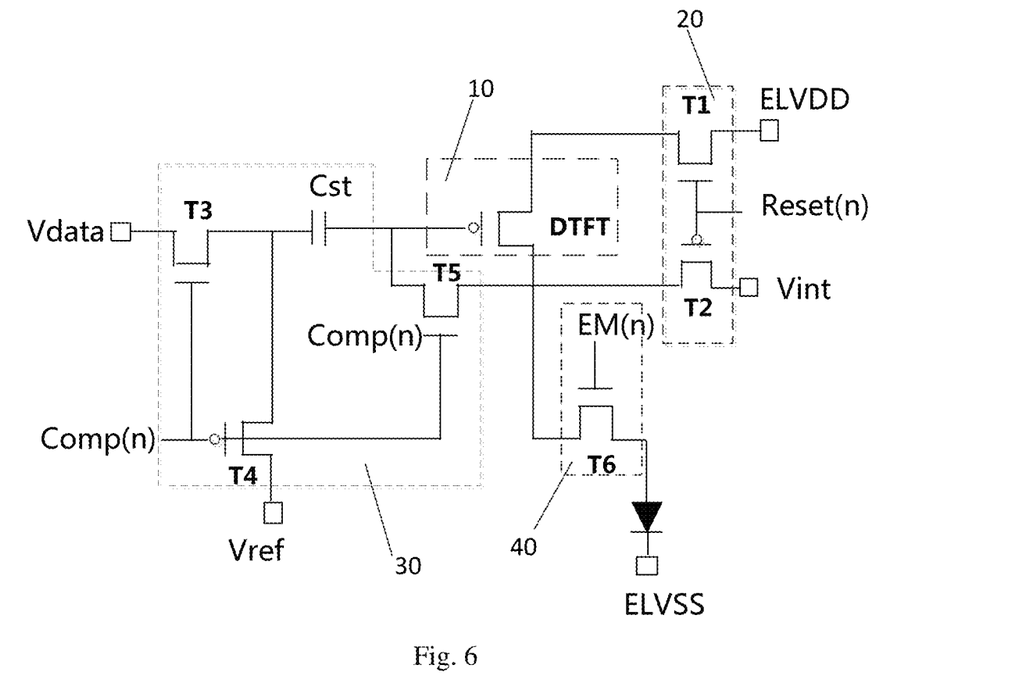
FIG. 6 is a schematic diagram of a specific structure of the pixel circuit shown in FIG. 3.

In addition to that the initialization sub-circuit 20 may input the voltage of the initial voltage terminal Vint to the driving sub-circuit 10 through the light-emitting enabling sub-circuit 40, the initialization sub-circuit 20 may input the voltage of the initial voltage terminal Vint to the driving sub-circuit 10 in other ways. As shown in FIG. 6, in some implementations, the initialization sub-circuit 20 includes: a first transistor T1 and a second transistor T2, a first electrode of the first transistor T1 is electrically coupled to the first power voltage terminal ELVDD, and a second electrode of the first transistor T1 is electrically coupled to the first electrode of the driving transistor DTFT, a gate of the first transistor T1 is electrically coupled to the reset signal terminal Reset, a first electrode of the second transistor T2 is electrically coupled to the initial voltage terminal Vint, and a second electrode of the second transistor T2 is electrically coupled to the second electrode of the driving transistor DTFT, and a gate of the second transistor T2 is electrically coupled to the reset signal terminal Reset.

It should be noted that, in this embodiment, the initialization sub-circuit 20 may further include a plurality of switching transistors coupled in parallel with the first transistor T1 and/or a plurality of switching transistors coupled in parallel with the second transistor T2. The foregoing is only an example of the initialization sub-circuit 20, and other structures having the same functions as those of the initialization sub-circuit 20 are not described herein again, and should fall within the protection scope of the present disclosure.

Figure 11:
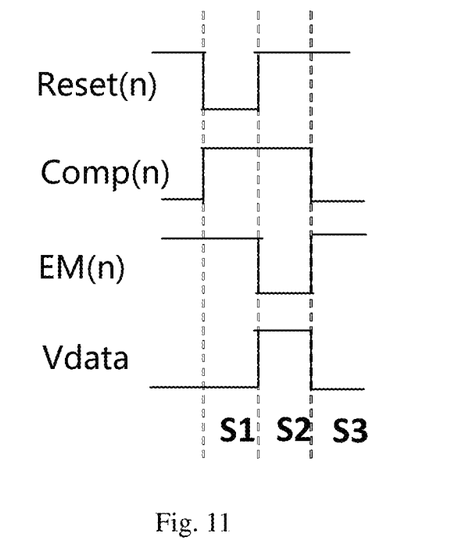
FIG. 11 is a timing diagram of signals employed by the pixel circuit shown in FIG. 5.

Further, the first transistor T1 is an N-type transistor, the second transistor T2 is a P-type transistor, alternatively, the first transistor is a P-type transistor, and the second transistor is an N-type transistor. In the present embodiment, the first transistor and the second transistor are of different types. In the present embodiment, when the reset signal terminal supplies a high level signal, the N-type transistor is turned on, and the P-type transistor is turned off, as shown in FIG. 11, and when the reset signal terminal supplies a low level signal, the P-type transistor is turned on, and the N-type transistor is turned off. In the initialization phase and the light-emitting phase, the reset signal terminal supplies a low level signal, and in the writing compensation phase, the reset signal terminal provides a high level signal.

In some implementations, as shown in FIG. 2 and FIG. 5, the light-emitting enabling sub-circuit 40 includes a sixth transistor T6, a first electrode of the sixth transistor T6 is electrically coupled to the light-emitting device L and the initialization sub-circuit 20, respectively, a second electrode of the sixth transistor T6 is electrically coupled to the second electrode of the driving transistor DTFT, and a gate of the sixth transistor T6 is electrically coupled to the enabling signal terminal EM.

It should be noted that the light-emitting enabling sub-circuit 40 may further include a plurality of transistors coupled in parallel. The above is only an example of the light-emitting enabling sub-circuit 40, and other structures having the same functions as those of the light-emitting enabling sub-circuit 40 are not described herein again, and should fall within the protection scope of the present disclosure.

In some implementations, as shown in FIG. 2 and FIG. 5, the writing compensation sub-circuit 30 includes a third transistor T3, a fourth transistor T4, a fifth transistor T5 and a storage capacitor Cst, a first electrode of the third transistor T3 is electrically coupled to the data signal terminal Vdata, a second electrode of the third transistor T3 is electrically coupled to a second end of the storage capacitor, and a gate of the third transistor T3 is electrically coupled to the scanning signal terminal Comp; a first electrode of the fourth transistor T4 is electrically coupled to the reference signal terminal Vref, a second electrode of the fourth transistor T4 is electrically coupled to the second end of the storage capacitor, and a gate of the fourth transistor T4 is electrically coupled to the scanning signal terminal Comp; a first electrode of the fifth transistor T5 is electrically coupled to the second electrode of the driving transistor DTFT, and a second electrode of the fifth transistor T5 is coupled to the gate of the driving transistor DTFT, and a gate of the fifth transistor T5 is electrically coupled to the scanning signal terminal Comp; a first end of the storage capacitor is electrically coupled to the gate of the driving transistor DTFT. In a case where the third transistor and the fourth transistor are turned on, the second end of the storage capacitor is electrically coupled to the data signal terminal Vdata and the reference signal terminal Vref, respectively.

It should be noted that, in this embodiment, the writing compensation sub-circuit 30 may further include a plurality of switching transistors coupled in parallel with the third transistor T3, and/or a plurality of switching transistors coupled in parallel with the fourth transistor T4, and/or a plurality of switching transistors coupled in parallel with the fifth transistor T5, the forgoing are merely illustrative of the writing compensation sub-circuit 30. Other structures having the same functions as those of the writing compensation sub-circuit 30 are not described herein again, and should fall within the protection scope of the present disclosure.

Further, the third transistor T3 and the fifth transistor T5 are N-type transistors, the fourth transistor T4 is a P-type transistor; alternatively, the third transistor T3 and the fifth transistor T5 are P-type transistors, and the fourth transistor T4 is an N-type transistor. In the present embodiment, the first transistor T1 and the second transistor T2 are of different types. In the present embodiment, when the reset signal terminal Reset supplies a high level signal, the N-type transistor is turned on, and the P-type transistor is turned off, as shown in FIG. 11, when the reset signal terminal Reset supplies a low level signal, the P-type transistor is turned on and the N-type transistor is turned off. In the initialization phase and the writing compensation phase, the scanning signal terminal Comp supplies a high level signal, and in the light-emitting phase, the scanning signal terminal Comp supplies a low level signal.

In some implementations, as shown in FIG. 2 and FIG. 5, the light-emitting device L includes a light-emitting diode, a first electrode of the light-emitting diode is electrically coupled to the light-emitting enabling sub-circuit 40, and a second electrode of the light-emitting diode is electrically coupled to the second power voltage terminal.

In another aspect, as shown in FIG. 5, an embodiment of the present disclosure provides a pixel driving the circuit, including: a data signal terminal Vdata, a reference signal terminal Vref, a scanning signal terminal Comp, a reset signal terminal Reset, an enabling signal terminal EM, an initial voltage terminal Vint, a first power voltage terminal ELVDD, a second power voltage terminal, a driving transistor DTFT, a storage capacitor Cst, a light-emitting diode L and six transistors T1 to T6. A gate of the driving transistor is coupled to a first end of the storage capacitor, a second electrode of the light-emitting diode L is coupled to the second power voltage terminal. A gate of the first transistor T1 is coupled to the reset signal terminal Reset, a first electrode of the first transistor T1 is coupled to the first power voltage terminal ELVDD, a second electrode of the first transistor T1 is coupled to the first electrode of the driving transistor DTFT. A gate of the second transistor T2 is coupled to the reset signal terminal Reset, and a first electrode of the second transistor T2 is coupled to the initial voltage terminal Vint, and a second electrode of the second transistor T2 is coupled to the second electrode of the driving transistor DTFT. A gate of the third transistor T3 is coupled to the scanning signal terminal Comp, a first electrode of the third transistor T3 is coupled to the data signal terminal Vdata, and a second electrode of the third transistor T3 is coupled to the second end of the storage capacitor. A gate of the fourth transistor T4 is coupled to the scanning signal terminal Comp, a first electrode of the fourth transistor T4 is coupled to the reference signal terminal Vref, a second electrode of the fourth transistor T4 is coupled to the second end of the storage capacitor. A gate of the fifth transistor T5 is coupled to the scanning signal terminal Comp, a first electrode of the fifth transistor T5 is coupled to the second electrode of the driving transistor DTFT, a second electrode of the fifth transistor T5 is coupled to the gate of the driving transistor DTFT. A gate of the sixth transistor T6 is coupled to the enabling signal terminal EM, a first electrode of the sixth transistor T6 is coupled to the second electrode of the driving transistor DTFT, and a second electrode of the sixth transistor T6 is coupled to the first electrode of the light-emitting diode.

The operation process and principle of the pixel circuit in the present embodiment are described below. The operation process of the pixel circuit includes an initialization phase, a writing compensation phase and a light-emitting phase.

Figure 7:
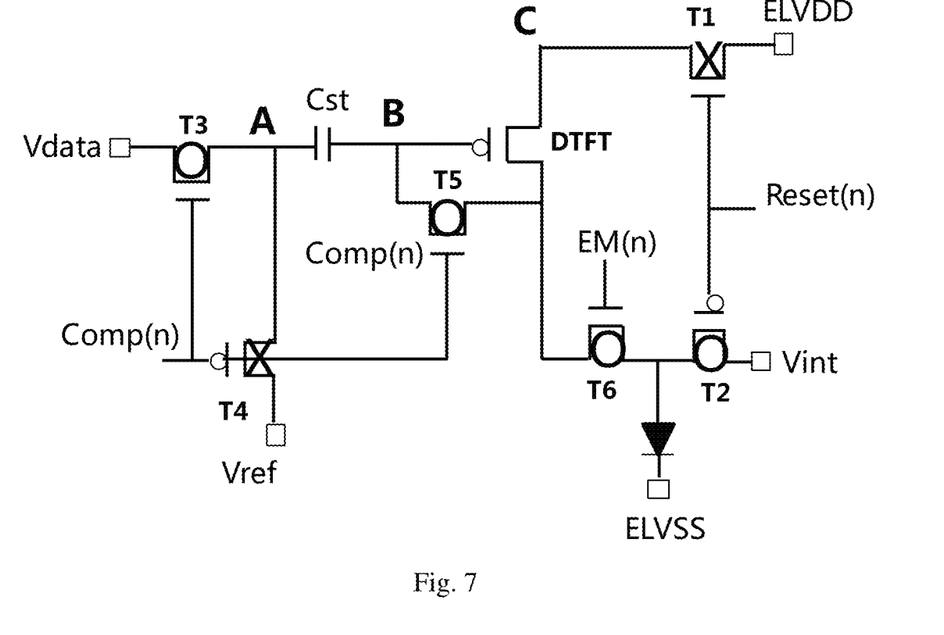
FIG. 7 is a schematic structural diagram of the pixel circuit shown in FIG. 5 in an initialization phase.

In the initialization phase, as shown in FIG. 7, the first transistor T1 and the fourth transistor T4 are controlled to be turned off, and the second transistor T2, the third transistor T3, the fifth transistor T5, and the sixth transistor T6 are controlled to be turned on, due to the previous frame of image, an initial voltage of the source of the driving transistor DTFT is the voltage of the first power voltage terminal ELVDD which is at a high level. After entering the initialization phase, the driving transistor DTFT is in a turn-on state, since the source of the driving transistor DTFT is disconnected from the first power voltage terminal ELVDD but is coupled to the initial voltage terminal Vint, so that the source of the driving transistor DTFT discharges to the initial voltage terminal Vint, thereby the voltage of the source of the driving transistor DTFT is continuously decreased, and the voltage of the gate of the driving transistor DTFT maintains the initial voltage terminal voltage Vint, when the gate-source voltage Vgs of the driving transistor DTFT becomes the threshold voltage Vth of the driving transistor DTFT, the driving transistor DTFT is turned off. At this time, the voltage at the point A is Vdata, and the voltage at the point B is Vint, the voltage at the point C is Vint−Vth, such that the gate-source voltage of the driving transistor DTFT is the threshold voltage Vth of the driving transistor DTFT.

Figure 8:
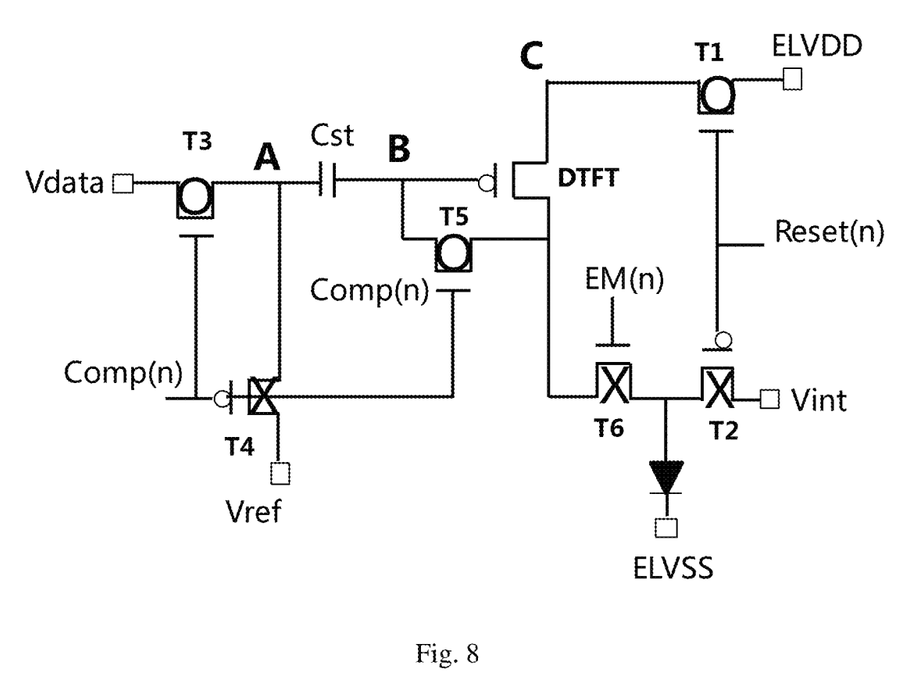
FIG. 8 is a schematic structural diagram of the pixel circuit shown in FIG. 5 in a data writing compensation phase.

In the writing compensation phase, as shown in FIG. 8, the first transistor T1, the third transistor T3 and the fifth transistor T5 are controlled to be turned on, and the second transistor T2, the fourth transistor T4 and the sixth transistor T6 are controlled to be turned off, so that the driving transistor DTFT is turned on. Since the source of the driving transistor DTFT is coupled to the first power voltage terminal ELVDD, and the gate-source voltage of the driving transistor DTFT maintains unchanged and at Vth, so the threshold voltage Vth can be written to the point B, so that the voltage at the point B is ELVDD+Vth, the voltage at the point C is ELVDD, and the voltage at the point A is Vdata because the point A is coupled to the data signal terminal Vdata, therefore, the data voltage at the data signal terminal Vdata is written to the storage capacitor Cst.

Figure 9:
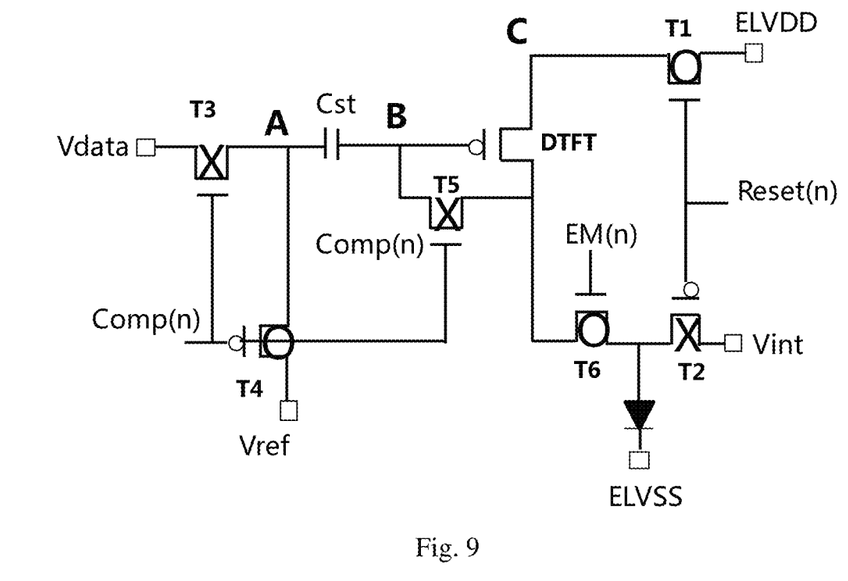
FIG. 9 is a schematic structural diagram of the pixel circuit shown in FIG. 5 in a writing compensation phase and a light-emitting phase.

In the light-emitting phase, as shown in FIG. 9, the first transistor T1, the fourth transistor T4 and the sixth transistor T6 are controlled to be turned on, and the second transistor T2, the third transistor T3 and the fifth transistor T5 are controlled to be turned off, so that the driving transistor DTFT is turned on, at this time, since the second end of the storage capacitor Cst is coupled to the reference signal terminal Vref, and the voltage across the storage capacitor Cst is a fixed value, that is, Vdata−ELVDD−Vth, the data voltages of the data signal terminal Vdata and the reference signal terminal Vref can be written to point B, so that the voltage at the point B becomes Vref−Vdata+ELVDD+Vth, and the voltage at the point A is Vref, the voltage at the point C is ELVDD since the point C is coupled to the first power voltage terminal ELVDD. In this case, the driving sub-circuit 10 supplies a driving current to the light-emitting device L to cause the light-emitting device L to emit light.

The driving current of the driving transistor DTFT is:

$$I_{OLED}=WC_{ox}u/2L*(Vgs-Vth)^2$$

$$I_{OLED}=WC_{ox}u/2L*(ELVDD+Vth+Vref-Vdata-ELVDD-Vth)^2$$

$$I_{OLED}=WC_{ox}u/2L*(Vref-Vdata)^2$$

Where W is a width of the driving transistor; L is a length of the driving transistor; u is a mobility of material; $C_{ox}$ is a capacitance of the driving transistor.

Therefore, when data compensation is performed on the driving transistor DTFT, the driving current $I_{OLED}$ input into the light-emitting device L can be independent of the threshold voltage Vth of the driving transistor DTFT, thereby realizing data compensation for the driving sub-circuit, eliminating the influence of the threshold voltage of the driving transistor on the light-emitting device L.

The present embodiment provides a pixel circuit, during switching from a frame of image to the next one, the initialization sub-circuit can input, under the control of the reset signal terminal, the voltage of the initial voltage terminal to the gate of the driving transistor, and the voltage of the source of the driving transistor can be continuously discharged to the initial voltage terminal when the driving transistor is turned on, until the gate-source voltage of the driving transistor becomes the threshold voltage of the driving transistor, at which the driving transistor is turned off. Since the initial gate-source voltage of the driving transistor in each of the sub-pixels in the display substrate becomes the threshold voltage of the driving transistor, all the driving transistors in the sub-pixels of the display substrate are in a same charge trapping state. Therefore, regardless of the data voltage of the previous frame of image, all the driving transistors enter into a data voltage writing state from the same state when entering the next frame of image, thereby improving the short-term residual image problem due to the hysteresis effect. In addition, the pixel circuit can further input the data voltage outputted by the data signal terminal to the driving transistor of the driving sub-circuit through the third transistor, the fourth transistor, the fifth transistor and the storage capacitor, so that the driving current input into the light-emitting device is independent of the threshold voltage of the driving transistor, thereby eliminating the influence of the threshold voltage on the brightness of the emitted light, and achieving data compensation for the driving sub-circuit.

In further another aspect, an embodiment of the present disclosure further provides a display substrate, including: a plurality of sub-pixel units arranged in an array, each of the sub-pixel units including the pixel circuit described above.

Specific operation process and operation principle of the present embodiment have been described in detail in the above embodiments, and are not described herein.

The present embodiment provides a display substrate, including: a plurality of sub-pixel units arranged in an array, each of the sub-pixel units including the pixel circuit described above. Each pixel circuit includes: an initialization sub-circuit, a driving sub-circuit, a writing compensation sub-circuit, a light-emitting enabling sub-circuit and a light-emitting device. When switching from a frame of image to the next one, the initialization sub-circuit can input, under the control of the reset signal terminal, the voltage of the initial voltage terminal to the gate of the driving transistor in the driving sub-circuit, and the voltage of the source of the driving transistor can be continuously discharged to the initial voltage terminal when the driving transistor is turned on, until the gate-source voltage of the driving transistor becomes the threshold voltage of the driving transistor, at which the driving transistor can be turned off. Since the initial gate-source voltage of the driving transistor in each of the sub-pixels in the display substrate becomes the threshold voltage of the driving transistor, all the driving transistors in the sub-pixels of the display substrate are in a same charge trapping state. Therefore, regardless of the data voltage of the previous frame of image, all the driving transistors enter into a data voltage writing state from the same state when entering the next frame of image, thereby improving the short-term residual image problem due to the hysteresis effect. In addition, in the pixel circuit, the data voltage outputted by the data signal terminal can be further input, by the writing compensation sub-circuit, to the driving transistor of the driving sub-circuit in the compensation phase to perform data compensation on the driving transistor, so that the driving current input to the light-emitting device when the light-emitting device emits light is independent of the threshold voltage of the driving transistor, thereby eliminating the influence of the threshold voltage on the brightness of the emitted light, and achieving data compensation for the driving sub-circuit.

In still another aspect, an embodiment of the present disclosure further provides a display device including the above display substrate.

Specific operation process and operation principle of the present embodiment have been described in detail in the above embodiments, and are not described herein.

An embodiment of the present disclosure provides a display device including the above display substrate, each pixel circuit of the display substrate including: an initialization sub-circuit, a driving sub-circuit, a writing compensation sub-circuit, a light-emitting enabling sub-circuit and a light-emitting device. When switching from a frame of image to the next one, the initialization sub-circuit can input, under the control of the reset signal terminal, the voltage of the initial voltage terminal to the gate of the driving transistor in the driving sub-circuit, and the voltage of the source of the driving transistor can be continuously discharged to the initial voltage terminal when the driving transistor is turned on, until the gate-source voltage of the driving transistor becomes the threshold voltage of the driving transistor, at which the driving transistor can be turned off. Since the initial gate-source voltage of the driving transistor in each of the sub-pixels in the display substrate becomes the threshold voltage of the driving transistor, all the driving transistors in the sub-pixels of the display substrate are in a same charge trapping state. Therefore, regardless of the data voltage of the previous frame of image, all the driving transistors enter into a data voltage writing state from the same state from the same state when entering the next frame, thereby improving the short-term residual image problem due to the hysteresis effect. In addition, in the pixel circuit, the data voltage outputted by the data signal terminal can be further input, by the writing compensation sub-circuit, to the driving transistor of the driving sub-circuit in the compensation phase to perform data compensation on the driving transistor, so that the driving current input to the light-emitting device when the light-emitting device emits light is independent of the threshold voltage of the driving transistor, thereby eliminating the influence of the threshold voltage on the brightness of the emitted light, and achieving data compensation for the driving sub-circuit.

Figure 10:
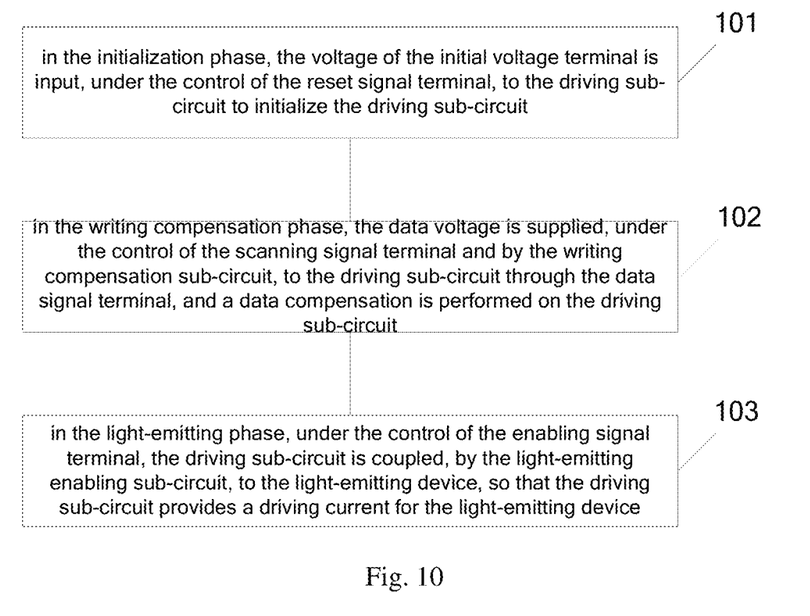
FIG. 10 is a flowchart of a driving method for a pixel circuit according to an embodiment of the present disclosure.

In further still another aspect, as shown in FIG. 10, an embodiment of the present disclosure further provides a driving method for the pixel circuit described above, including a initialization phase, a writing compensation phase and a light-emitting phase, the driving method includes following steps.

Step 101, in the initialization phase, the voltage of the initial voltage terminal is input, under the control of the reset signal terminal, to the driving sub-circuit to initialize the driving sub-circuit.

Step 102, in the writing compensation phase, the data voltage is supplied, under the control of the scanning signal terminal and by the writing compensation sub-circuit, to the driving sub-circuit through the data signal terminal Vdata, and a data compensation is performed on the driving sub-circuit.

Step 103, in the light-emitting phase, under the control of the enabling signal terminal, the driving sub-circuit is coupled, by the light-emitting enabling sub-circuit, to the light-emitting device, so that the driving sub-circuit provides a driving current for the light-emitting device.

Specific operation process and operation principle of the present embodiment have been described in detail in the above embodiments, and are not described herein.

The present embodiment provides a driving method for a pixel circuit, including an initialization phase, in which, under the control of the reset signal terminal, the voltage of the initial voltage terminal can be input to the gate of the driving transistor in the driving sub-circuit, and the voltage of the source of the driving transistor can be continuously discharged to the initial voltage terminal when the driving transistor is turned on, until the gate-source voltage of the driving transistor becomes the threshold voltage of the driving transistor, at which the driving transistor can be turned off. Since the initial gate-source voltage of the driving transistor in each of the sub-pixels in the display substrate becomes the threshold voltage of the driving transistor, all the driving transistors in the sub-pixels of the display substrate are in a same charge trapping state. Therefore, regardless of the data voltage of the previous frame of image, all the driving transistors enter into a data voltage writing state from the same state when entering the next frame of image, thereby improving the short-term residual image problem due to the hysteresis effect. In addition, in the pixel circuit, the data voltage outputted by the data signal terminal can be further input to the driving transistor of the driving sub-circuit in the compensation phase to perform data compensation on the driving transistor, so that the driving current input to the light-emitting device is independent of the threshold voltage of the driving transistor, thereby eliminating the influence of the threshold voltage on the brightness of the emitted light, and achieving data compensation for the driving sub-circuit.

The above description is only specific embodiments of the present disclosure, but the scope of the present disclosure is not limited thereto, and any person skilled in the art can easily conceive variations or substitutions within the technical scope of the disclosure. The variations or substitutions should be considered falling within the scope of protection of the present disclosure. The scope of protection of the present disclosure should be determined by the scope of the claims.

The invention claimed is:

1. A pixel circuit, comprising: an initialization sub-circuit, a writing compensation sub-circuit, a light-emitting enabling sub-circuit, a light-emitting device and a driving sub-circuit, wherein the driving sub-circuit comprises a driving transistor configured to supply a driving current to the light-emitting device;

the light-emitting enabling sub-circuit is respectively coupled to an enabling signal terminal, the driving sub-circuit and the light-emitting device, and is configured to electrically couple the driving sub-circuit to the light-emitting device under control of the enabling signal terminal;

the initialization sub-circuit is respectively coupled to a first power voltage terminal, an initial voltage terminal, a reset signal terminal and the driving sub-circuit, and is configured to input, under control of the reset signal terminal, a voltage of the initial voltage terminal to the driving sub-circuit to initialize the driving sub-circuit;

the writing compensation sub-circuit is respectively coupled to a scanning signal terminal, a data signal terminal, a reference signal terminal and the driving sub-circuit, and is configured to input, under control of the scanning signal terminal, a data voltage output by the data signal terminal to the driving sub-circuit to perform a data compensation on the driving sub-circuit, wherein the initialization sub-circuit is further coupled to the light-emitting enabling sub-circuit to input, under the control of the enabling signal terminal and the reset signal terminal, a voltage of the initial voltage terminal to the driving sub-circuit through the light-emitting enabling sub-circuit to initialize the driving sub-circuit.

2. The pixel circuit of claim 1, wherein
the initialization sub-circuit comprises a first transistor and a second transistor,
a first electrode of the first transistor is electrically coupled to the first power voltage terminal, a second electrode of the first transistor is electrically coupled to a first electrode of the driving transistor, and a gate of the first transistor is electrically coupled to the reset signal terminal;
a first electrode of the second transistor is electrically coupled to the initial voltage terminal, a second electrode of the second transistor is electrically coupled to the light-emitting enabling sub-circuit, and a gate of the second transistor is electrically coupled to the reset signal terminal.

3. The pixel circuit of claim 1, wherein
the initialization sub-circuit comprises a first transistor and a second transistor,
a first electrode of the first transistor is electrically coupled to the first power voltage terminal, a second electrode of the first transistor is electrically coupled to a first electrode of the driving transistor, and a gate of the first transistor is electrically coupled to the reset signal terminal;
a first electrode of the second transistor is electrically coupled to the initial voltage terminal, a second electrode of the second transistor is electrically coupled to a second electrode of the driving transistor, and a gate of the second transistor is electrically coupled to the reset signal terminal.

4. The pixel circuit of claim 2, wherein
the first transistor is an N-type transistor, and the second transistor is a P-type transistor, or the first transistor is a P-type transistor and the second transistor is an N-type transistor.

5. The pixel circuit of claim 3, wherein
the first transistor is an N-type transistor, and the second transistor is a P-type transistor, or
the first transistor is a P-type transistor and the second transistor is an N-type transistor.

6. The pixel circuit of claim 2, wherein
the light-emitting enabling sub-circuit comprises a sixth transistor;
a first electrode of the sixth transistor is electrically coupled to the light-emitting device and the initialization sub-circuit respectively, a second electrode of the sixth transistor is electrically coupled to a second electrode of the driving transistor, and a gate of the sixth transistor is electrically coupled to the enabling signal terminal.

7. The pixel circuit of claim 3, wherein
the light-emitting enabling sub-circuit comprises a sixth transistor;
a first electrode of the sixth transistor is electrically coupled to the light-emitting device, a second electrode of the sixth transistor is electrically coupled to a second electrode of the driving transistor, and a gate of the sixth transistor is electrically coupled to the enabling signal terminal.

8. The pixel circuit of claim 6, wherein
the writing compensation sub-circuit comprises a third transistor, a fourth transistor, a fifth transistor and a storage capacitor;
a first electrode of the third transistor is electrically coupled to the data signal terminal, a second electrode of the third transistor is electrically coupled to a second end of the storage capacitor, and a gate of the third transistor is electrically coupled to the scanning signal terminal;
a first electrode of the fourth transistor is electrically coupled to the reference signal terminal, a second electrode of the fourth transistor is electrically coupled to the second end of the storage capacitor, and a gate of the fourth transistor is electrically coupled to the scanning signal terminal;
a first electrode of the fifth transistor is electrically coupled to the second electrode of the driving transistor, a second electrode of the fifth transistor is coupled to a gate of the driving transistor, and a gate of the fifth transistor is electrically coupled to the scanning signal terminal;
a first end of the storage capacitor is electrically coupled to the gate of the driving transistor.

9. The pixel circuit of claim 7, wherein
the writing compensation sub-circuit comprises a third transistor, a fourth transistor, a fifth transistor and a storage capacitor;
a first electrode of the third transistor is electrically coupled to the data signal terminal, a second electrode of the third transistor is electrically coupled to a second end of the storage capacitor, and a gate of the third transistor is electrically coupled to the scanning signal terminal;
a first electrode of the fourth transistor is electrically coupled to the reference signal terminal, a second electrode of the fourth transistor is electrically coupled to the second end of the storage capacitor, and a gate of the fourth transistor is electrically coupled to the scanning signal terminal;

a first electrode of the fifth transistor is electrically coupled to the second electrode of the driving transistor, a second electrode of the fifth transistor is coupled to a gate of the driving transistor, and a gate of the fifth transistor is electrically coupled to the scanning signal terminal;

a first end of the storage capacitor is electrically coupled to the gate of the driving transistor.

10. The pixel circuit of claim 8, wherein the third transistor and the fifth transistor are N-type transistors; the fourth transistor is a P-type transistor;

or, the third transistor and the fifth transistor are P-type transistors; and the fourth transistor is an N-type transistor.

11. The pixel circuit of claim 9, wherein the third transistor and the fifth transistor are N-type transistors; the fourth transistor is a P-type transistor;

or, the third transistor and the fifth transistor are P-type transistors; and the fourth transistor is an N-type transistor.

12. The pixel circuit of claim 8, wherein the light-emitting device comprises a light-emitting diode;

a first electrode of the light-emitting diode is electrically coupled to the second electrode of the sixth transistor, and a second electrode of the light-emitting diode is electrically coupled to a second power voltage terminal.

13. The pixel circuit of claim 9, wherein the light-emitting device comprises a light-emitting diode;

a first electrode of the light-emitting diode is electrically coupled to the second electrode of the sixth transistor, and a second electrode of the light-emitting diode is electrically coupled to a second power voltage terminal.

14. A display substrate, comprising:

a plurality of sub-pixel units arranged in an array, each of the sub-pixel units comprising the pixel circuit of claim 1.

15. A display substrate, comprising:

a plurality of sub-pixel units arranged in an array, each of the sub-pixel units comprising the pixel circuit of claim 12.

16. A display substrate, comprising:

a plurality of sub-pixel units arranged in an array, each of the sub-pixel units comprising the pixel circuit of claim 13.

17. A display device, comprising the display substrate of claim 14.

18. A display device, comprising the display substrate of claim 15.

19. A driving method for the pixel circuit of claim 1, comprising an initialization phase, a writing compensation phase and a light-emitting phase, in the initialization phase, under the control of the reset signal terminal, the voltage of the initial voltage terminal is input to the driving sub-circuit to initialize the driving sub-circuit;

in the writing compensation phase, under the control of the scanning signal terminal, the data voltage is supplied, by the writing compensation sub-circuit, to the driving sub-circuit through the data signal terminal, and a data compensation is performed on the driving sub-circuit;

in the light-emitting phase, under the control of the enabling signal terminal, the driving sub-circuit is coupled, by the light-emitting enabling sub-circuit, to the light-emitting device, so that the driving sub-circuit provides a driving current for the light-emitting device.

* * * * *